US 7,391,671 B2

(12) United States Patent
Shin

(10) Patent No.: US 7,391,671 B2
(45) Date of Patent: Jun. 24, 2008

(54) DATA INPUT DEVICE FOR USE IN SEMICONDUCTOR MEMORY DEVICE

(75) Inventor: Beom-Ju Shin, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 157 days.

(21) Appl. No.: 11/477,483

(22) Filed: Jun. 30, 2006

(65) Prior Publication Data

US 2007/0071074 A1   Mar. 29, 2007

(30) Foreign Application Priority Data

Sep. 29, 2005   (KR) ...................... 10-2005-0090882
Mar. 23, 2006   (KR) ...................... 10-2006-0026483

(51) Int. Cl.
*G11C 7/00*   (2006.01)
(52) U.S. Cl. .................... 365/233; 365/191; 365/193; 365/194
(58) Field of Classification Search ................ 365/233, 365/191, 193, 194
See application file for complete search history.

(56) References Cited

U.S. PATENT DOCUMENTS

| 6,615,345 B1 | 9/2003 | LaBerge |
| 6,728,144 B2 | 4/2004 | Nygren |
| 7,020,031 B2 | 3/2006 | Shin et al. |
| 7,106,646 B2 * | 9/2006 | Schoenfeld et al. ......... 365/222 |
| 7,218,557 B1 * | 5/2007 | Chlipala et al. ............. 365/193 |
| 2005/0138277 A1 | 6/2005 | Koo |

FOREIGN PATENT DOCUMENTS

| JP | 2005-78547 A | 3/2005 |
| KR | 1996-0042733 | 12/1996 |
| KR | 1997-0051200 | 7/1997 |
| KR | 1998-055819 | 9/1998 |
| KR | 100186102 B1 | 12/1998 |
| KR | 100239713 B1 | 10/1999 |
| KR | 10-2001-0004018 | 1/2001 |
| KR | 10-2004-0098904 | 11/2004 |

OTHER PUBLICATIONS

Korean Office Action issued in Korean Patent Application No. KR 10-2006-0026483, mailed Dec. 18, 2007.
Korean Office Action issued in Korean Patent Application No. KR 10-2006-0026483, mailed Dec. 18, 2007.

* cited by examiner

*Primary Examiner*—Pho M. Luu
(74) *Attorney, Agent, or Firm*—McDermott Will & Emery LLP

(57) ABSTRACT

A data input device for use in a semiconductor memory device includes a synchronization control unit for receiving a data strobe signal with which a data is synchronized in order to generate a synchronization signal in response to a driving signal; and a synchronization unit for storing internal data input sequentially one-bit by one-bit into a plurality of synchronous storing elements and asynchronous storing elements and for outputting the stored data as parallel-typed aligned data all at once in synchronization with the synchronization signal.

17 Claims, 6 Drawing Sheets

DATA INPUT DEVICE FOR USE IN SEMICONDUCTOR MEMORY DEVICE

FIELD OF THE INVENTION

The present invention relates to semiconductor device design technology; and, more particularly, to a data input device for use in a semiconductor memory device which performs a pre-fetch operation to input data.

DESCRIPTION OF RELATED ARTS

For improving a data processing performance, a semiconductor memory device capable of performing a pre-fetch operation has been developed. Generally, the pre-fetch operation is a data transferring method used in a dynamic random access memory (DRAM) where a data bit is synchronized with a rising edge and a falling edge of a clock.

A technique for the pre-fetch operation has been improved for pre-fetching more data bits. That is, in a double data rate (DDR) SDRAM, the pre-fetch operation is performed on a 2-bit pre-fetching basis. In a DDR2 SDRAM and a DDR3 SDRAM, the pre-fetch operation is performed on a 4-bit pre-fetching basis and an 8-bit pre-fetching basis respectively.

FIG. 1 is a block diagram showing a conventional DDR2 SDRAM.

As shown, a data input device for receiving data sequentially input one-bit by one-bit is disclosed. The data input device aligns the sequentially input data to a 4-bit parallel data and, then, outputs the aligned 4-bit data (ALGN0, ALGN1, ALGN2, ALGN3). As above-described, the aligning process, i.e., aligning data sequentially input one-bit by one-bit to a parallel form, is called the pre-fetch operation.

For instance, in case that a burst length is 4, sequentially input 4 data bits are stored into memory cells at one time after the last, fourth, data bit is input. Therefore, until the last fourth data bit is input, the previously input three data bits are stored in a shift register included in the data input device. Since a data bit is input in synchronization with a data strobe signal DQS, the shift register is operated in synchronization with the data strobe signal DQS so that a previously input data bit is not overwritten by a newly input data bit.

FIG. 2 is a block diagram depicting the conventional data input device.

As shown, the conventional data input device includes a first buffer 10, a synchronization control unit 40 and a synchronization unit.

The first buffer 10 receives a data DIN in response to a driving signal EN. The synchronization control unit 40 generates first and second synchronization signals DQSRP4D and DQSFP4D activated at an edge of the date strobe signal DQS in response to the driving signal EN. The synchronization unit stores internal data IN output from the first buffer 10 and outputs the stored data as aligned parallel data ALGN0, ALGN1, ALGN2 and ALGN3 in synchronization with the first and the second synchronization signals DQSRP4D and DQSFP4D.

The synchronization control unit 40 includes a second buffer 42 for receiving the data strobe signal DQS and an inverted data strobe signal DQSB in response to the driving signal EN; a signal generation unit 44 for generating a first and a second pre-synchronization signals DQSRP4 and DQSFP4 respectively activated at a rising edge and a falling edge of an output signal of the second buffer 42; a first delay element 46 for generating the first synchronization signal DQSRP4D by delaying the first pre-synchronization signal DQSRP4 for a predetermined delay time; and a second delay element 48 for generating the second synchronization signal DQSFP4D by delaying the second pre-synchronization signal DQSFP4 for a predetermined delay time.

The synchronization unit includes a latch unit 20 and a delay unit 30.

The latch unit 20 stores the internal data IN in a two-row parallel form in response to first and second synchronization signals DQSRP4D and DQSFP4D. The delay unit 30 delays output data of the latch unit 20 for a predetermined delay time to thereby generate the 4-bit aligned data ALGN0, ALGN1, ALGN2 and ALGN3.

The latch unit 20 includes a first latch 21 for storing the internal data IN in synchronization with an edge of the first synchronization signal DQSRP4D; a second latch 22 for storing data of the first latch 21 and for outputting the stored data as first output data D2 in synchronization with an edge of the second synchronization signal DQSFP4D; a third latch 23 for storing the internal data IN and for outputting the stored data as second output data D3 in synchronization with an edge of the second synchronization signal DQSFP4D; a fourth latch 24 for storing data of the second latch 22 in synchronization with an edge of the first synchronization signal DQSRP4D; a fifth latch 25 for storing data of the third latch 23 in synchronization with an edge of the first synchronization signal DQSRP4D; a sixth latch 26 for storing data (D05) of the fourth latch 24 and for outputting the stored data as a third output data D0 in synchronization with an edge of the second synchronization signal DQSFP4D; and a seventh latch 27 for storing data (D15) of the fifth latch 25 and for outputting the stored data as fourth output data D1 in synchronization with an edge of the second synchronization signal DQSFP4D.

The delay unit 30 includes a third to a sixth delay elements 32 to 38 for respectively delaying the first, the third, the fourth and the second output data D2, D0, D1 and D3 for a predetermined delay time.

FIG. 3 is a waveform diagram depicting an operation of the conventional data input device shown in FIG. 2.

Referring to FIGS. 2 and 3, the operation of the conventional data input device is described below.

The data DIN is input in synchronization with a rising edge and a falling edge of the data strobe signal DQS. Herein, the data DIN is numbered in the order of input timing.

The first buffer 10 receives the data DIN and outputs the received data as the internal data IN while the driving signal EN is activated, wherein the internal data IN has an internal voltage level. The synchronization control unit 40 twice activates the first and the second pre-synchronization signals DQSRP4 and DQSFP4 in turn in synchronization with a rising edge and a falling edge of the data strobe signal DQS respectively through the second buffer 42 which receives the data strobe signal DQS and the inverted data strobe signal DQSB and the signal generation unit 44.

Thereafter, the first and the second pre-synchronization signals DQSRP4 and DQSFP4 are respectively delayed by the first and the second delay elements 46 and 48 in order to satisfy a set-up time and a hold time of an internal data.

Thereafter, the first to the seventh latches 21 to 27 included in the latch unit 20 latch 4-bit internal data A0, A1, A2 and A3 in response to the first and the second synchronization signals DQSRP4D and DQSFP4D, which are sequentially activated. That is, the latch unit 20 aligns the internal data A0, A1, A2 and A3 sequentially input through the first buffer 10 into a parallel form by using the first to the seventh latches 21 to 27 operated by the first and the second synchronization signals DQSRP4D and DQSFP4D.

Thereafter, the delay unit 30 additionally delays the first to the fourth output data D2, D3, D0 and D1 output from the second, the third, the sixth and the seventh latches 22, 23, 26 and 27.

Meanwhile, according to the conventional data input device, in order to align input data into a parallel form without loss, the data should be shifted to be stored whenever a data bit is newly input. At this time, since the data shifting is performed in synchronization with a rising edge and a falling edge of a data strobe signal, power is wasted due to the continuous data shifting. Further, a large size driver is required in order to drive a synchronization signal for the data shifting. Accordingly, power consumption is increased.

Since the above-mentioned power consumption occurs at each data input device for aligning data input through a data pad, the above-mentioned power consumption is a serious problem.

SUMMARY OF THE INVENTION

It is, therefore, an object of the present invention to provide a data input device for reducing power consumption.

In accordance with an aspect of the present invention, there is provided a data input device for use in a semiconductor memory device, including: a synchronization control unit for receiving a data strobe signal with which a data bit is synchronized in order to generate a synchronization signal in response to a driving signal; and a synchronization unit for storing internal data input sequentially one-bit by one-bit into a plurality of synchronous storing elements and asynchronous storing elements and for outputting the stored data as parallel aligned data at once in synchronization with the synchronization signal.

In accordance with an aspect of the present invention, there is provided a semiconductor memory device, including: an internal data strobe signal generator for generating an internal data strobe signal in response to a data strobe signal; a first data align unit for aligning a part of data input sequentially into first parallel data in response to the internal data strobe signal; a delay unit for delaying the first parallel data for a predetermined time to output delayed data; a second data align unit for aligning the delayed data into second parallel data in response to the internal data strobe signal; and a third data align unit for aligning the first parallel data and the second parallel into the third parallel data.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a data input device in accordance with the present invention will be described in detail referring to the accompanying drawings.

Figure 1:
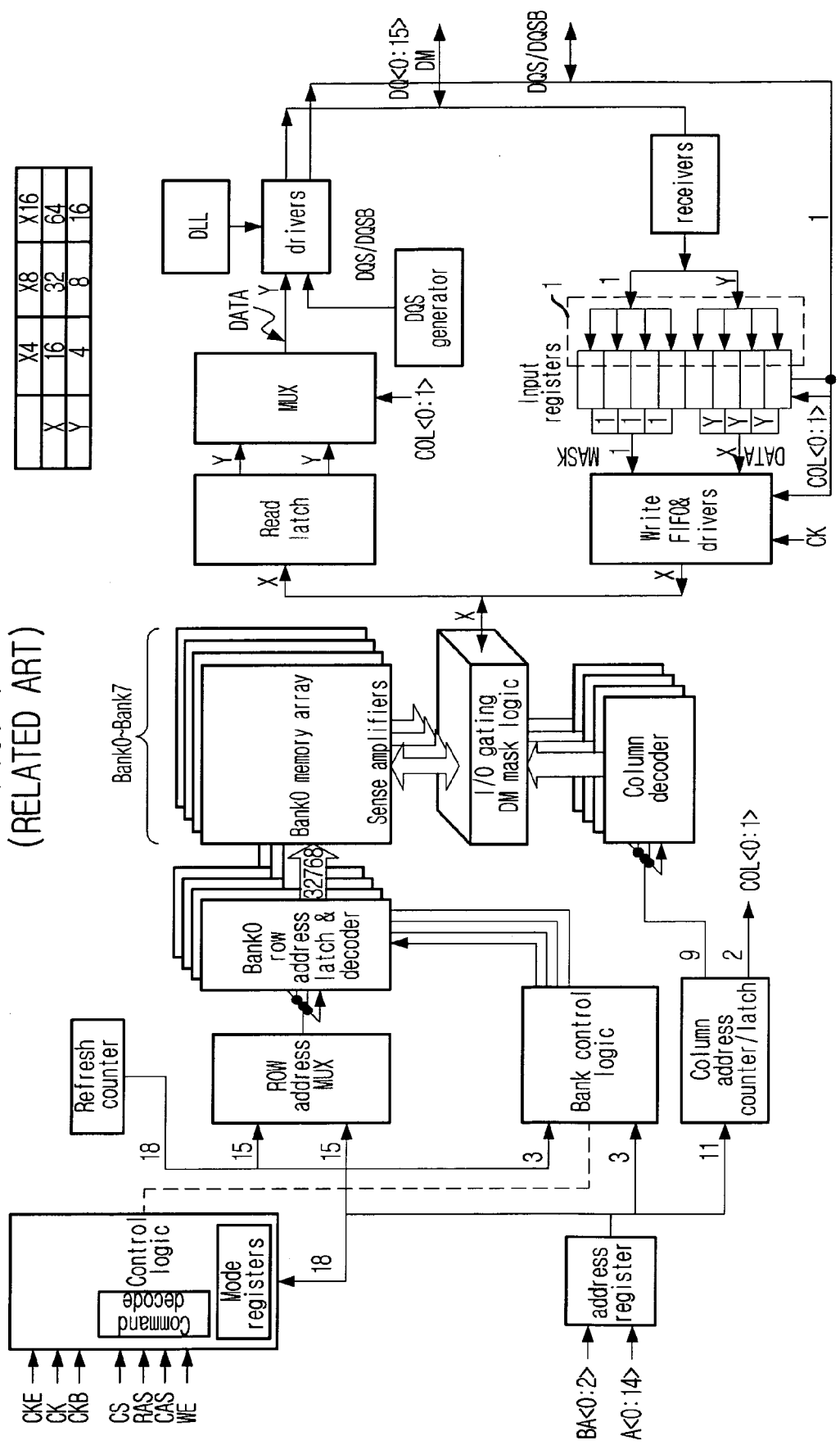
FIG. 1 is a block diagram showing a conventional DDR2 SDRAM.
Figure 2:
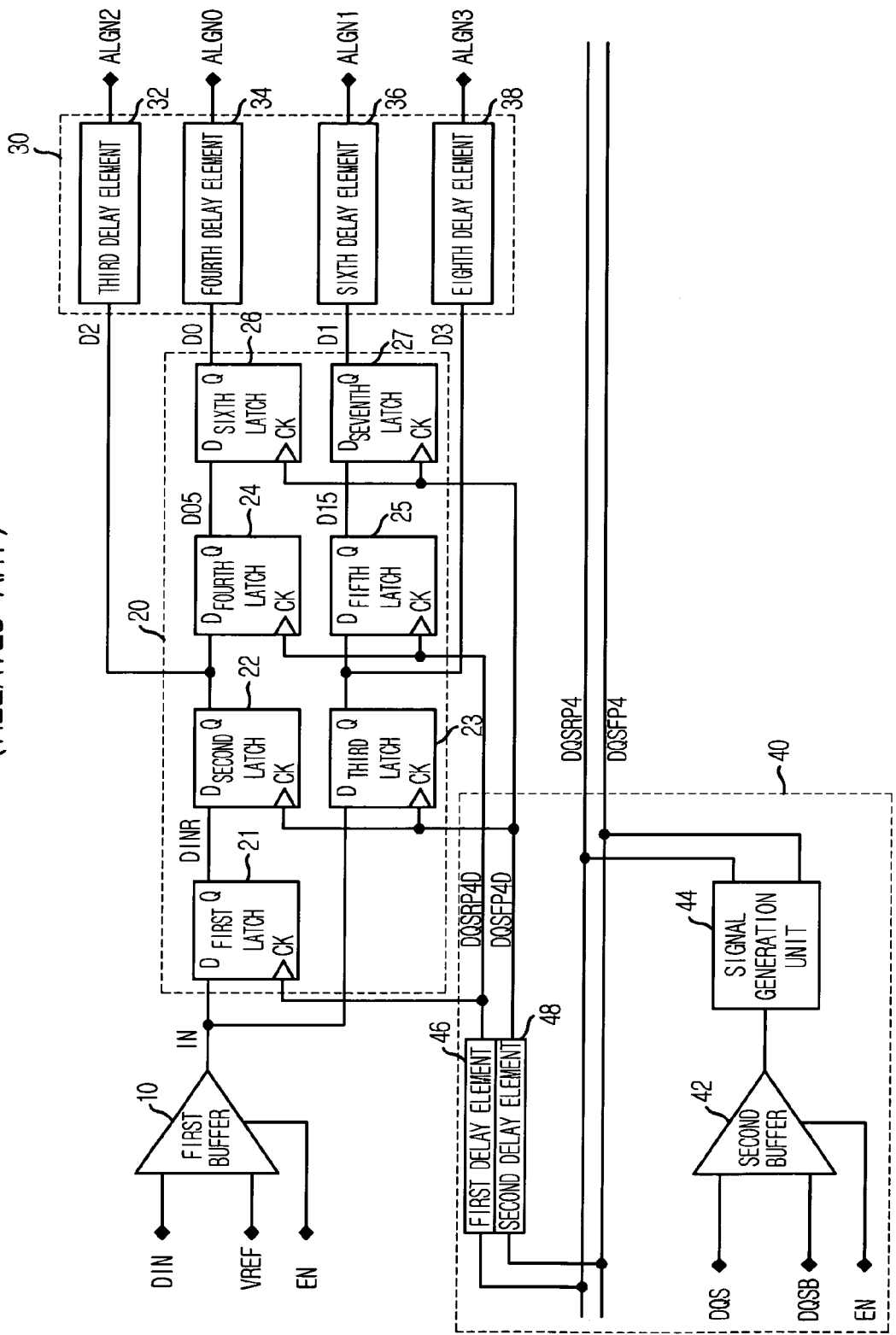
FIG. 2 is a block diagram depicting the conventional data input device.
Figure 3:
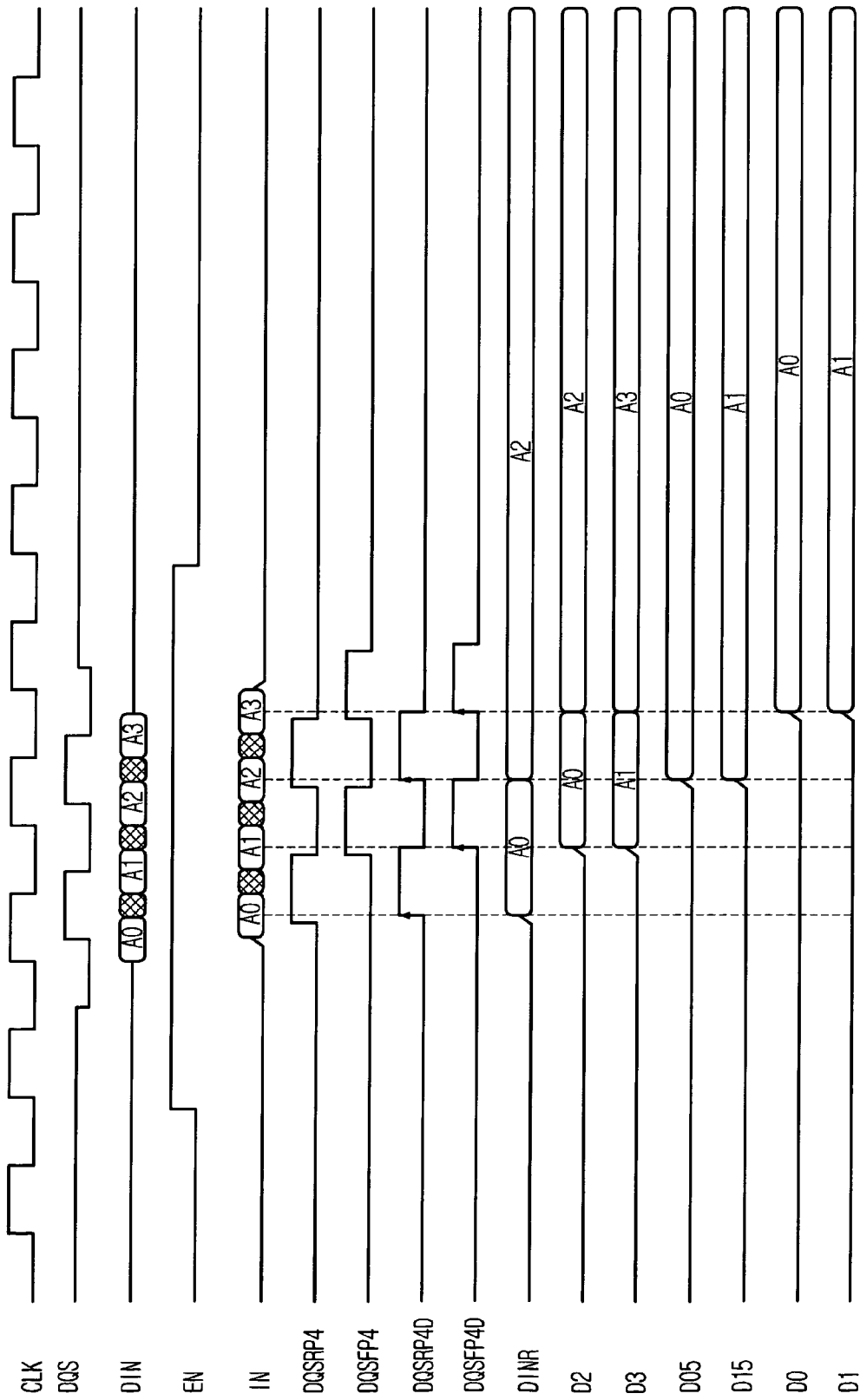
FIG. 3 is a waveform diagram depicting an operation of the conventional data input device shown in FIG. 2.
Figure 4:
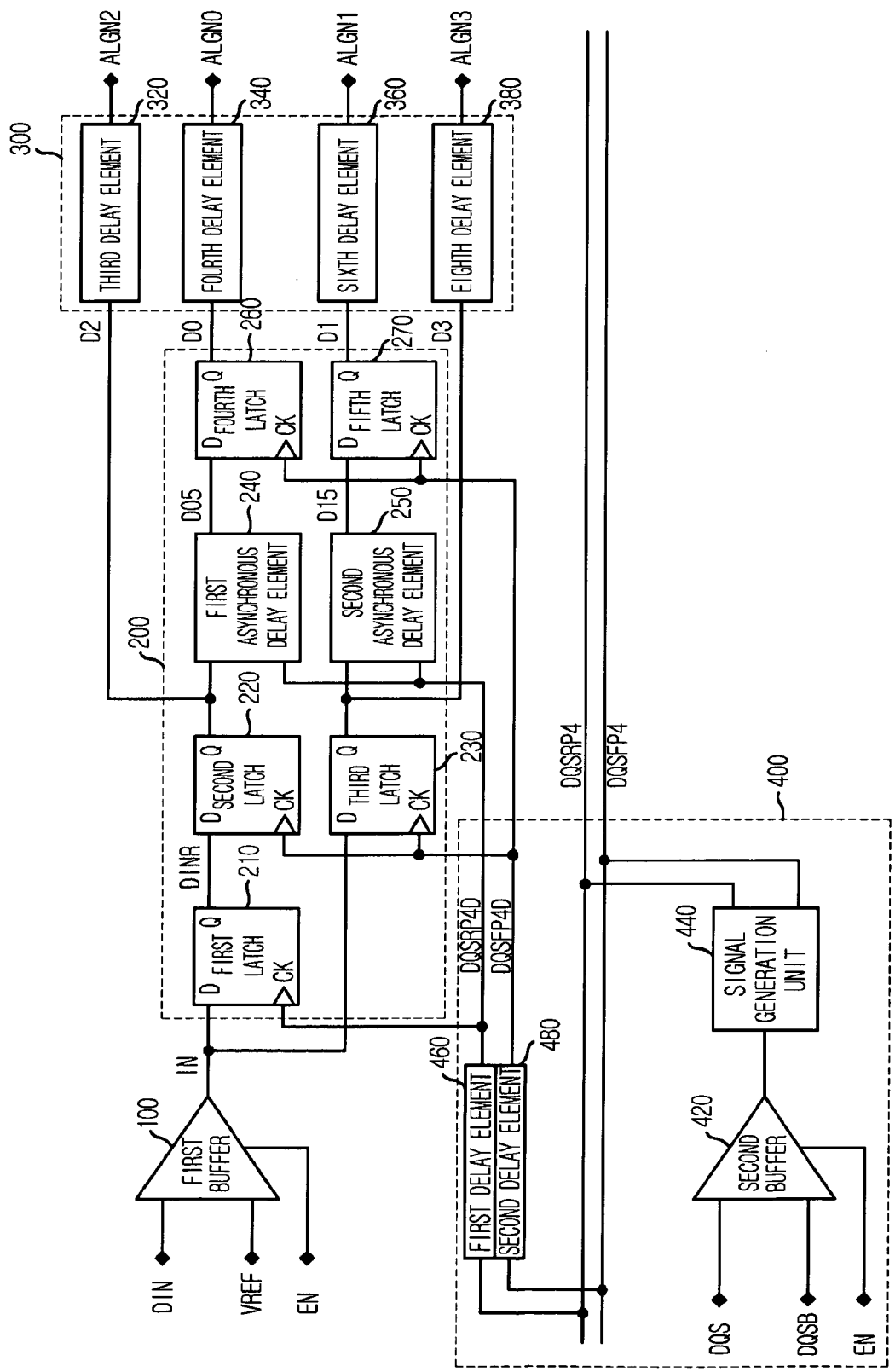
FIG. 4 is a block diagram of a data input device for use in a semiconductor memory device in accordance with a preferred embodiment of the present invention.

FIG. 4 is a block diagram of a data input device for use in a semiconductor memory device in accordance with a preferred embodiment of the present invention.

As shown, the data input device includes a first buffer 100, a synchronization control unit 400 and a synchronization unit.

The first buffer 100 receives data DIN in response to a driving signal EN. The synchronization control unit 400 generates a first and a second synchronization signals DQSRP4D and DQSFP4D activated at an edge of a date strobe signal DQS in response to the driving signal EN. The synchronization unit aligns internal data IN which is sequentially output one-bit by one-bit from the first buffer 100 by using a synchronous delay element and an asynchronous delay element and, then, outputs parallel-typed aligned data ALGN0, ALGN1, ALGN2 and ALGN3 all at once by synchronizing a plural bit of data with the first and the second synchronization signals DQSRP4D and DQSFP4D.

Herein, since the synchronous delay element receives and stores data in synchronization with a corresponding synchronization signal, the data are delayed for one cycle of the corresponding synchronization signal. The synchronous delay element can be embodied with a storing element such as a shifting element or a flip-flop.

The asynchronous delay element receives data without an operational limit due to a particular signal. Since the asynchronous delay element also delays a corresponding data bit, the asynchronous delay element can be embodied with a cross coupled latch or a capacitor and an inverter.

The synchronization control unit 400 includes a second buffer 420 for receiving the data strobe signal DQS and an inverted data strobe signal DQSB in response to the driving signal EN; a signal generation unit 440 for generating first and second pre-synchronization signals DQSRP4 and DQSFP4 respectively activated at a rising edge and a falling edge of an output signal of the second buffer 420; a first delay element 460 for generating the first synchronization signal DQSRP4D by delaying the first pre-synchronization signal DQSRP4 for a predetermined delay time; and a second delay element 480 for generating the second synchronization signal DQSFP4D by delaying the second pre-synchronization signal DQSFP4 for a predetermined delay time.

The synchronization unit includes a latch unit 200 and a delay unit 300.

The latch unit 200 stores the internal data IN in a two-row parallel form through the asynchronous delay element and the synchronous delay element operated by the first and the second synchronization signals DQSRP4D and DQSFP4D. The delay unit 300 delays first to fourth output data D0 to D3 of the latch unit 200 for a predetermined delay time to thereby generate the 4-bit aligned data ALGN0, ALGN1, ALGN2 and ALGN3.

The latch unit 200 includes a first latch 210 for storing the internal data IN in synchronization with an edge of the first synchronization signal DQSRP4D; a second latch 220 for storing data of the first latch 210 and for outputting the stored data as first output data D2 in synchronization with an edge of the second synchronization signal DQSFP4D; a third latch 230 for storing the internal data IN and for outputting the stored data as second output data D3 in synchronization with an edge of the second synchronization signal DQSFP4D; a first asynchronous delay element 240 for storing the first output data D2 output from the second latch 220; a second asynchronous delay element 250 for storing the second output data D3 output from the third latch 23; a fourth latch 260 for storing data (D05) of the first asynchronous delay element 240 and for outputting the stored data as third output data D0 in synchronization with an edge of the second synchronization signal DQSFP4D; and a fifth latch 270 for storing data (D15) of the second asynchronous delay element 250 and for outputting the stored data as fourth output data D1 in synchronization with an edge of the second synchronization signal DQSFP4D.

The delay unit 300 includes third to sixth delay elements 320 to 380 for respectively delaying the first, the third, the fourth and the second output data D2, D0, D1 and D3 for a predetermined delay time.

Therefore, in accordance with the preferred embodiment of the present invention, the asynchronous delay element is included so that sequentially input data are stored until the last, fourth, data bit is input. By using the asynchronous delay element, the power consumption caused by the continuous operation of a latch in synchronization with the first and the second synchronization signals DQSRP4D and DQSFP4D can be prevented.

Figure 5:
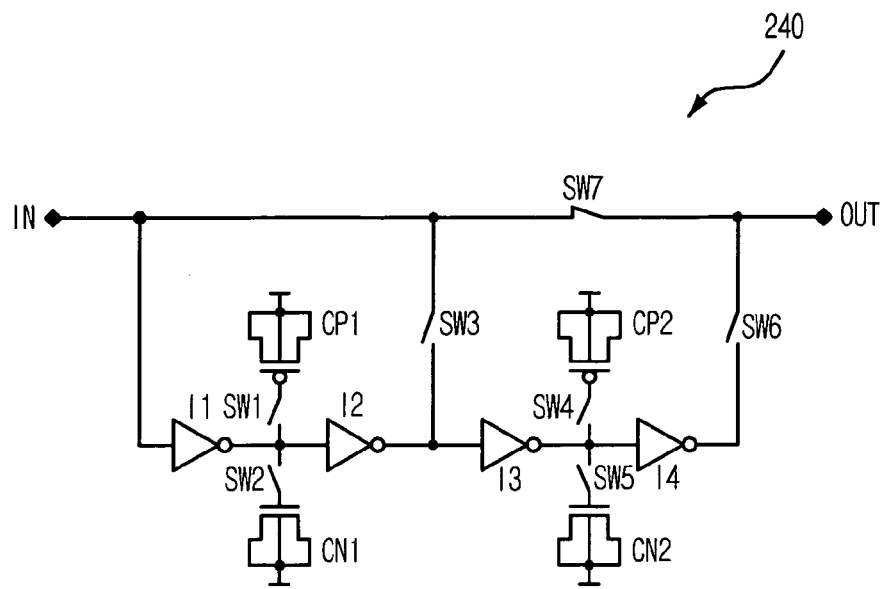
FIG. 5 is a schematic circuit diagram of the first asynchronous delay element shown in FIG. 4.

FIG. 5 is a schematic circuit diagram showing the first asynchronous delay element 240 shown in FIG. 4. Herein, a structure of the second asynchronous delay element 250 is same as that of the first asynchronous delay element 240.

As shown, the first asynchronous delay element 240 includes a first inverter I1 for inverting an input signal (IN) input through an input node; a first capacitor CP1 embodied with a p-type metal oxide semiconductor (PMOS) transistor; a first switch SW1 for connecting the first capacitor CP1 to an output node of the first inverter I1; a second capacitor CN1 embodied with an n-type metal oxide semiconductor (NMOS) transistor; a second switch SW2 for connecting the second capacitor CN1 to the output node of the first inverter I1; a second inverter I2 for inverting an output of the first inverter I1; a third switch SW3 for connecting the input node to an output node of the second inverter I2; a third inverter I3 for inverting an output of the second inverter I2; a third capacitor CP2 embodied with a PMOS transistor; a fourth switch SW4 for connecting the third capacitor CP2 to an output node of the third inverter I3; a fourth capacitor CN4 embodied with an NMOS transistor; a fifth switch SW5 for connecting the fourth capacitor CN2 to the output node of the third inverter I3; a fourth inverter I4 for inverting an output of the third inverter I3; a sixth inverter SW6 for connecting an output node of the fourth inverter I4 to an output node for outputting an output signal OUT; and a seventh switch SW7 for connecting the input node to the output node.

The first asynchronous delay element 240 having the above-mentioned structure adds or does not add an additional delay due to a capacitor by turning on/off a switch. Therefore, by controlling a switch, a delay time generated while a signal is passed from the input node to the output node can be controlled.

Figure 6:
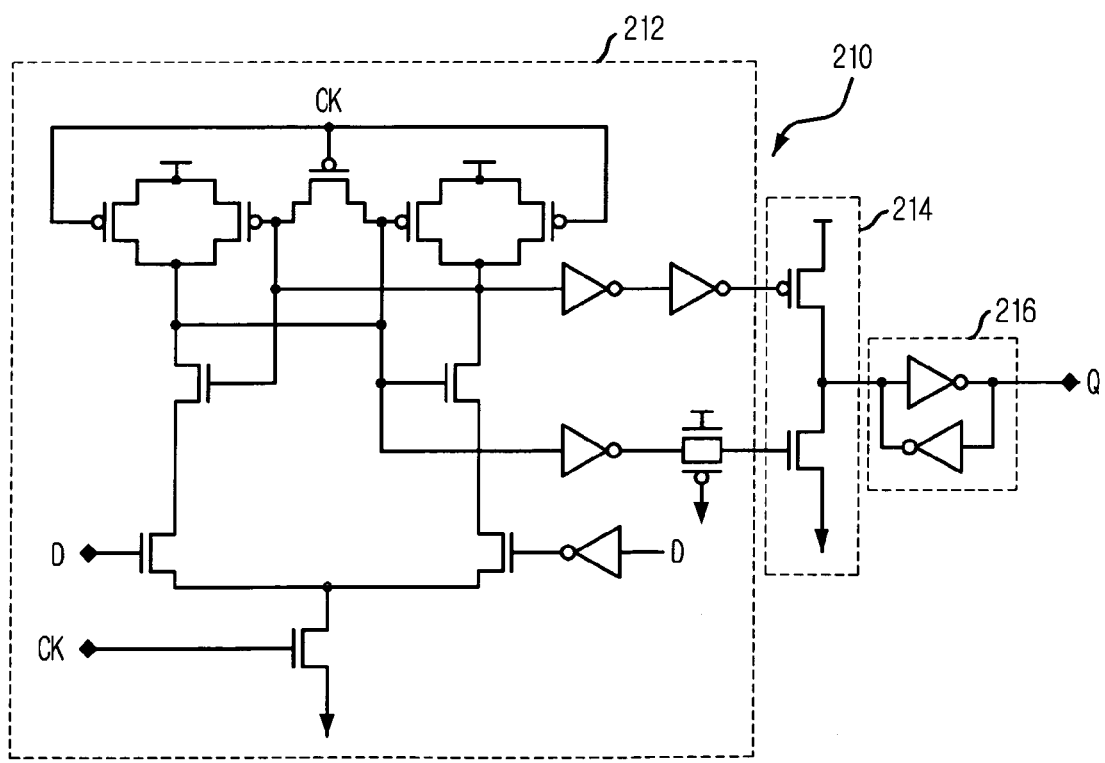
FIG. 6 is a schematic circuit diagram of the first latch shown in FIG. 4.

FIG. 6 is a schematic circuit diagram of the first latch 210 shown in FIG. 4. Herein, each structure of the second to the fifth latches is same as that of the first latch 210.

As shown, the first latch 210 includes a differential amplifier 212 for receiving an input signal D as a differential input when a clock signal CK is activated; a driver 214 for driving an output of the differential amplifier 212; and an output unit 216 for storing and outputting an output of the driver 214.

The first latch 210 receives the first synchronization signal DQSRP4D as the clock signal CK and receives the internal data IN output from the first buffer 100 as the input signal D.

Therefore, the first 210 stores and outputs the input signal D when the clock signal CK is activated.

Figure 7:
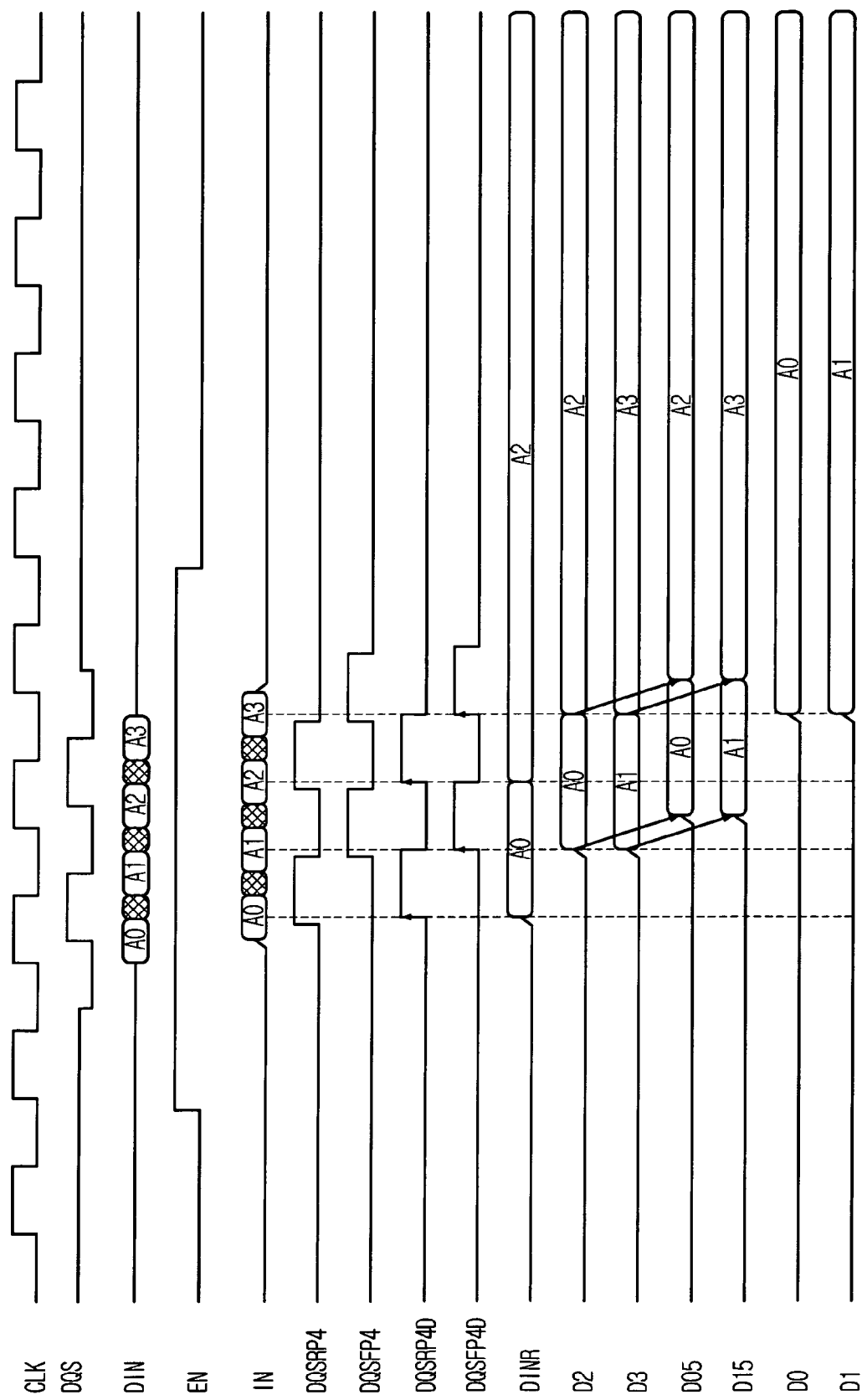
FIG. 7 is a waveform diagram showing an operation of the data input device shown in FIG. 4.

FIG. 7 is a waveform diagram showing an operation of the data input device shown in FIG. 4.

Referring to FIGS. 4 to 7, the operation of the data input device is described below.

The first buffer 100 receives the data DIN and outputs the received data as the internal data IN while the driving signal EN is activated, wherein the internal data IN has an internal voltage level. The synchronization control unit 400 twice activates the first and the second pre-synchronization signals DQSRP4 and DQSFP4 by turns in synchronization with a rising edge and a falling edge of the data strobe signal DQS respectively through the second buffer 420 which receives the data strobe signal DQS and the inverted data strobe signal DQSB and the signal generation unit 440.

Thereafter, the first and the second pre-synchronization signals DQSRP4 and DQSFP4 are respectively delayed by the first and the second delay elements 460 and 480 so that the internal data IN satisfies a set-up time and a hold time corresponding to the first and the second synchronization signals DQSRP4D and DQSFP4D. The delayed pre-synchronization signals DQSRP4 and DQSFP4 are respectively output as the first and the second synchronization signals DQSRP4D and DQSFP4D.

Thereafter, the first latch 210 stores an internal data bit A0 in response to an activation of the first synchronization signal DQSRP4D.

Thereafter, when the second synchronization signal DQSFP4D is activated, the second latch 220 stores an output data bit (A0) of the first latch 210 and the third latch 230 stores internal data bit A1. After a predetermined time, the first and the second asynchronous delay elements 240 and 250 store and output the internal data bits A0 and A1 respectively.

Therefore, while the first to the third latches 210 to 230 receive data in synchronization with a rising edge of one of the first and the second synchronization signals DQSRP4D and DQSFP4D, the first and the second asynchronous delay elements 240 and 250 store data without being synchronized with a synchronization signal after a predetermined delay time after the second and the third latches 220 and 230 store data.

Thereafter, when the first synchronization signal DQSRP4D is activated, the first latch 210 stores a newly input internal data bit A2.

Thereafter, when the second synchronization signal DQSFP4D is activated, the second latch 220 stores an output data bit (A2) of the first latch 210 and the third latch 230 stores a newly input internal data bit A3. The fourth latch 260 stores an output data bit (A0) of the first asynchronous delay element 240 and the fifth latch 270 stores an output data bit (A1) of the second asynchronous delay element 250.

The delay unit 300 adds an additional delay to the data bits A2, A3, A0 and A1 stored in the second, the third, the sixth and the seventh latches 220, 230, 260 and 270 to thereby generate parallel first to a fourth data bits ALGN0 to ALGN3.

The first and the second asynchronous delay elements 240 and 250 are included so that the fourth and the fifth latches 260 and 270 can stably receive data. That is, without the first and the second asynchronous delay elements 240 and 250, when the second and the third latches 220 and 230 store and output the internal data bits A0 and A1 in synchronization with the second synchronization signal DQSFP4D, the fourth and the fifth latches 260 and 270 cannot store the internal data bits A0 and A1 output from the second and the third latches 220 and 230 because there is not enough time margin. That is, for a latch to receive a data bit, the data should satisfy a set-up time and a hold time having a rising edge of a synchronization signal as a reference point.

Therefore, since the first and the second asynchronous delay elements 260 and 270 delay output data of the second and the third latches 220 and 230 for a predetermined delay time, the output data bits (A0, A1) can satisfy the set-up time and the hold time at a next activated second synchronization signal DQSFP4D and, thus, the fourth and the fifth latches 260 and 270 receive the data.

Therefore, in accordance with the preferred embodiment of the present invention, a continuous shifting operation performed in synchronization with a rising edge and a falling edge of a signal can be reduced by storing data using an asynchronous delay element. Accordingly, power consumption can be reduced.

Further, since the number of blocks which use a synchronization signal is decreased, a synchronization signal can be generated by using a driver having a lesser driving strength. Accordingly, a size of a driver can be reduced and power consumption also can be reduced.

As a result, by using the data input device in accordance with the present invention, size and power consumption of the data input device can be reduced.

The present application contains subject matter related to Korean patent application No. 2005-90882 and 2005-26483 filed in the Korea Patent Office on Sep. 29, 2006 and Mar. 23, 2005, respectively, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A data input device for use in a semiconductor memory device, comprising:
   a synchronization control unit for receiving a data strobe signal with which data are synchronized in order to generate a synchronization signal; and
   a synchronization unit for storing internal data input sequentially one-bit by one-bit into a plurality of synchronous storing elements and asynchronous storing elements and for outputting the stored data as parallel aligned data at once in synchronization with the synchronization signal.

2. The data input device as recited in claim 1, wherein the synchronization unit includes:
   a latch unit for storing the data in a two-row parallel form having the plurality of synchronous storing elements operated by a first or a second synchronization signal and the plurality of asynchronous storing elements; and
   a delay unit for delaying each bit of plural-bit output data output from the latch unit for each predetermined delay time to thereby output the delayed data as the parallel aligned data.

3. The data input device as recited in claim 2, wherein the asynchronous storing element is configured with a cross-coupled inverter.

4. The data input device as recited in claim 3, wherein the synchronous storing element is configured with a shifting element or a flip-flop.

5. The data input device as recited in claim 4, wherein the latch unit includes:
   a first latch for storing the internal data in synchronization with an edge of the first synchronization signal;
   a second latch for storing data of the first latch and for outputting the stored data as first output data in synchronization with an edge of the second synchronization signal;
   a third latch for storing the internal data and for outputting the stored data as second output data in synchronization with an edge of the second synchronization signal;
   a first asynchronous storing element for storing the first output data output from the second latch and for outputting the stored data after delaying the stored data for a predetermined delay time;
   a second asynchronous storing element for storing the second output data output from the third latch and for outputting the stored data after delaying the stored data for a predetermined delay time;
   a fourth latch for storing data of the first asynchronous storing element and for outputting the stored data as third output data in synchronization with an edge of the second synchronization signal; and
   a fifth latch for storing data of the second asynchronous storing element and for outputting the stored data as fourth output data in synchronization with an edge of the second synchronization signal.

6. The data input device as recited in claim 5, wherein the synchronization control unit includes:
   a buffer for receiving the data strobe signal and an inverted data strobe signal in response to the driving signal;
   a signal generation unit for generating first and second pre-synchronization signals respectively synchronized with a rising edge and a falling edge of an output signal of the buffer;
   a first delay element for generating the first synchronization signal by delaying the first pre-synchronization signal for a predetermined delay time; and
   a second delay element for generating the second synchronization signal by delaying the second pre-synchronization signal for a predetermined delay time.

7. A data input device for use in a semiconductor memory device, comprising:
   a synchronization control unit for receiving a data strobe signal with which a data is synchronized in order to generate a synchronization signal in response to a driving signal; and
   a synchronization unit for storing internal data input sequentially one-bit by one-bit into a plurality of synchronous delay elements and asynchronous delay elements and for outputting the stored data as parallel aligned data at once in synchronization with the synchronization signal.

8. The data input device as recited in claim 7, wherein the synchronization unit includes:
   a latch unit for storing the data in a two-row parallel form having the plurality of synchronous delay elements operated by a first or a second synchronization signal and the plurality of asynchronous delay elements; and
   a delay unit for delaying each bit of plural-bit output data output from the latch unit for each predetermined delay time to thereby output the delayed data as the parallel aligned data.

9. The data input device as recited in claim 8, the asynchronous delay element is embodied with a capacitor and an inverter.

10. The data input device as recited in claim 9, wherein the synchronous delay element is embodied with a shifting element or a flip-flop.

11. The data input device as recited in claim 10, wherein the latch unit includes:

a first latch for storing the internal data in synchronization with an edge of the first synchronization signal;

a second latch for storing a data of the first latch and for outputting the stored data as a first output data in synchronization with an edge of the second synchronization signal;

a third latch for storing the internal data and for outputting the stored data as a second output data in synchronization with an edge of the second synchronization signal;

a first asynchronous storing element for storing the first output data output from the second latch and for outputting the stored data after delaying the stored data for a predetermined delay time;

a second asynchronous storing element for storing the second output data output from the third latch and for outputting the stored data after delaying the stored data for a predetermined delay time;

a fourth latch for storing a data of the first asynchronous storing element and for outputting the stored data as a third output data in synchronization with an edge of the second synchronization signal; and a fifth latch for storing a data of the second asynchronous storing element and for outputting the stored data as a fourth output data in synchronization with an edge of the second synchronization signal.

12. The data input device as recited in claim 11, wherein the asynchronous delay element includes:

a first inverter for inverting an input signal input through an input node;

a first capacitor embodied with a p-type metal oxide semiconductor (PMOS) transistor;

a first switch for connecting the first capacitor to an output node of the first inverter;

a second capacitor embodied with an n-type metal oxide semiconductor (NMOS) transistor;

a second switch for connecting the second capacitor to the output node of the first inverter;

a second inverter for inverting an output of the first inverter;

a third switch for connecting the input node to an output node of the second inverter;

a third inverter for inverting an output of the second inverter;

a third capacitor embodied with a PMOS transistor;

a fourth switch for connecting the third capacitor to an output node of the third inverter;

a fourth capacitor embodied with an NMOS transistor;

a fifth switch for connecting the fourth capacitor to the output node of the third inverter;

a fourth inverter for inverting an output of the third inverter;

a sixth inverter for connecting an output node of the fourth inverter to an output node for outputting an output signal; and a seventh switch for connecting the input node to the output node.

13. The data input device as recited in claim 12, wherein the synchronization control unit includes:

a buffer for receiving the data strobe signal and an inverted data strobe signal in response to the driving signal;

a signal generation unit for generating a first and a second pre-synchronization signals respectively synchronized with a rising edge and a falling edge of an output signal of the buffer;

a first delay element for generating the first synchronization signal by delaying the first pre-synchronization signal for a predetermined delay time; and a second delay element for generating the second synchronization signal by delaying the second pre-synchronization signal for a predetermined delay time.

14. The data input device as recited in claim 13, wherein the delay unit includes a third to a sixth delay elements for adding a predetermined delay time to the first to the fourth output data.

15. The data input device as recited in claim 14, wherein the latch includes:

a differential amplifier for receiving an input signal as a differential input when the synchronization signal is activated;

a driver for driving an output signal of the differential amplifier; and an output unit for storing and outputting an output signal of the driver.

16. The data input device as recited in claim 7, further comprising a buffer for receiving the data and for outputting the received data as the internal data in response to the driving signal.

17. A semiconductor memory device, comprising:

an internal data strobe signal generator for generating an internal data strobe signal in response to a data strobe signal;

a first data align unit for aligning a part of data input sequentially into a first parallel data in response to the internal data strobe signal;

a delay unit for delaying the first parallel data for a predetermined time to output a delayed data; and a second data align unit for aligning the delayed data into a second parallel data in response to the internal data strobe signal.

* * * * *